US012795806B2

(12) United States Patent
Hawley et al.

(10) Patent No.: US 12,795,806 B2
(45) Date of Patent: Nov. 10, 2026

(54) SINGLE ARC CASCADED LOW PRESSURE COATING GUN UTILIZING A NEUTRODE STACK AS A METHOD OF PLASMA ARC CONTROL

(71) Applicant: OERLIKON METCO (US) INC., Westbury, NY (US)

(72) Inventors: David Hawley, Huntington Beach, CA (US); Jose Colmenares, Malverne, NY (US); Jonathan Gutleber, Westbury, NY (US)

(73) Assignee: OERLIKON METCO (US) INC., Westbury, NY (US)

( * ) Notice: Subject to any disclaimer, the term of this patent is extended or adjusted under 35 U.S.C. 154(b) by 0 days.

(21) Appl. No.: 16/970,086

(22) PCT Filed: Feb. 19, 2019

(86) PCT No.: PCT/US2019/018539
§ 371 (c)(1),
(2) Date: Aug. 14, 2020

(87) PCT Pub. No.: WO2019/164822
PCT Pub. Date: Aug. 29, 2019

(65) Prior Publication Data

US 2021/0037635 A1 Feb. 4, 2021

Related U.S. Application Data

(60) Provisional application No. 62/632,899, filed on Feb. 20, 2018.

(51) Int. Cl.
*H05H 1/28* (2006.01)
*C23C 4/134* (2016.01)
(Continued)

(52) U.S. Cl.
CPC ............... *H05H 1/28* (2013.01); *C23C 4/134* (2016.01); *H01J 37/32* (2013.01); *H05H 1/00* (2013.01); *H05H 1/16* (2013.01); *H05H 1/24* (2013.01)

(58) Field of Classification Search
None
See application file for complete search history.

(56) References Cited

U.S. PATENT DOCUMENTS 3,343,027 A * 9/1967 Frohlich .................. H05H 1/40 313/46
3,453,474 A * 7/1969 Cann ........................ H05H 1/40 376/141
(Continued)

FOREIGN PATENT DOCUMENTS

CA 3057456 A1 * 9/2018 ............... H05H 1/28
EP 0289961 11/1988
(Continued)

OTHER PUBLICATIONS

Europe Search Report/Office Action conducted in counterpart Europe Appln. No. 19758027.7 (Oct. 27, 2021).
(Continued)

*Primary Examiner* — Srinivas Sathiraju
(74) *Attorney, Agent, or Firm* — GREENBLUM & BERNSTEIN, P.L.C.

(57) ABSTRACT

Vacuum plasma gun and method of controlling plasma arc in a vacuum plasma gun. Vacuum plasma gun includes a rear gun body section having an electrode, and a cascade section configured to connect to the rear gun body section. The cascade section includes a plurality of neutrodes arranged to form a neutrode stack. The method includes connecting a cascade neutrode stack to a rear body section of a vacuum plasma gun.

21 Claims, 5 Drawing Sheets

(51) Int. Cl.

| | |
|---|---|
| ***H01J 37/32*** | (2006.01) |
| ***H05H 1/00*** | (2006.01) |
| ***H05H 1/16*** | (2006.01) |
| ***H05H 1/24*** | (2006.01) |

(56) References Cited

U.S. PATENT DOCUMENTS 4,328,257 A * 5/1982 Muehlberger .......... B05B 7/226 219/121.36
4,429,612 A * 2/1984 Tidman ..................... F41B 6/00 376/125
4,474,604 A * 10/1984 Nakamura ................ B22F 9/10 75/333
4,590,842 A * 5/1986 Goldstein ................. F41B 6/00 376/125
4,640,180 A * 2/1987 Rose ......................... F41B 6/00 89/8
4,659,899 A * 4/1987 Welkie .................. H01J 27/022 219/121.48
4,689,468 A * 8/1987 Muehlberger .......... C23C 4/137 219/121.52
4,715,261 A * 12/1987 Goldstein ................. F41B 6/00 89/8
4,780,591 A * 10/1988 Bernecki .................. H05H 1/36 219/121.48
4,788,408 A * 11/1988 Wlodarczyk ............ H05H 1/34 219/121.48
4,821,508 A * 4/1989 Burton .................. F03H 1/0087 60/204
5,225,652 A * 7/1993 Landes .................... H05H 1/42 219/121.48
5,332,601 A * 7/1994 Varacalle, Jr. .......... C04B 41/87 427/452
5,332,885 A * 7/1994 Landes .................... H05H 1/44 219/121.52
5,406,046 A * 4/1995 Landes ................... C23C 4/134 219/121.48
5,412,173 A * 5/1995 Muehlberger ........... H05H 1/42 219/121.48
5,637,242 A * 6/1997 Muehlberger ....... B23K 10/027 219/121.51
5,837,959 A * 11/1998 Muehlberger ........... H05H 1/42 427/446
5,944,901 A * 8/1999 Landes .................... H05H 1/34 219/121.48
6,124,563 A * 9/2000 Witherspoon ............ C23C 4/12 427/446
6,392,189 B1 * 5/2002 Delcea ..................... H05H 1/42 219/76.16
6,969,819 B1 * 11/2005 Griffin ..................... H05H 1/34 219/121.48
7,281,478 B2 * 10/2007 Wang ....................... H05H 1/34 219/121.36
D562,856 S * 2/2008 Hawley ........................ D15/144
7,550,693 B2 * 6/2009 Hughes .............. B23K 26/0096 219/121.63
7,582,846 B2 * 9/2009 Molz ........................ H05H 1/34 219/121.48
7,750,265 B2 * 7/2010 Belashchenko .......... H05H 1/34 219/121.36
8,258,423 B2 * 9/2012 Severance, Jr. .......... H05H 1/34 219/121.48
8,530,870 B2 * 9/2013 Kakizaki .............. H05G 2/0094 250/431
8,841,641 B2 * 9/2014 Kakizaki .............. H05G 2/0094 250/431
9,226,378 B2 * 12/2015 Hamatani ................ H05H 1/34
9,463,881 B2 * 10/2016 Palmer .................... B64G 1/002
9,730,306 B2 * 8/2017 Molz ........................ H05H 1/34
9,772,157 B2 * 9/2017 Yoakam .................. F41A 21/30
10,485,086 B2 * 11/2019 Laurisch ................ H05H 7/001
10,570,892 B2 * 2/2020 Woodruff ............... B64G 1/413
10,669,046 B2 * 6/2020 Palmer ...................... B64G 5/00
10,945,330 B2 * 3/2021 Keller ...................... H05H 1/28
2006/0292891 A1 * 12/2006 Bijker ...................... H05H 1/34 438/778
2007/0138147 A1 * 6/2007 Molz ......................... C23C 4/12 219/121.55
2009/0110814 A1 * 4/2009 Muggli ................... C23C 4/129 118/308
2010/0125267 A1 * 5/2010 Lee ...................... A61B 18/042 315/111.21
2011/0079506 A1 * 4/2011 Bijker ...................... H05H 1/34 422/186.04
2012/0240771 A1 * 9/2012 Gindrat ................... C23C 4/134 427/446
2014/0326703 A1 * 11/2014 Molz ........................ H05H 1/34 219/121.48
2015/0287571 A1 * 10/2015 Kiehlbauch ....... H01J 37/32449 156/345.33
2015/0319833 A1 * 11/2015 Molz ........................ H05H 1/34 165/104.19
2015/0329953 A1 * 11/2015 Molz .................... H05H 1/3457 239/132.3
2016/0167063 A1 * 6/2016 Hawley ................... B05B 7/222 118/302
2016/0296955 A1 * 10/2016 Molz ........................ H05H 1/42
2019/0141828 A1 * 5/2019 Keller ...................... H05H 1/34
2020/0151239 A1 * 5/2020 Molz ...................... G01N 29/14
2020/0163198 A1 * 5/2020 Molz .................... H05H 1/3478
2021/0037635 A1 * 2/2021 Hawley ................... H01J 37/32
2021/0358718 A1 * 11/2021 Rhyner ............. H01J 37/32183

FOREIGN PATENT DOCUMENTS

RU 2355135 5/2016
WO 2004/105450 12/2004
WO WO-2013130046 A2 * 9/2013 ............... H05H 1/34
WO 2014/120357 8/2014
WO 2018/035619 3/2018
WO 2018/170090 9/2018
WO WO-2019164822 A1 * 8/2019 .............. H01J 37/32

OTHER PUBLICATIONS

Int'l Search Report (Form PCT/ISA/210) conducted in Int'l Appln. No. PCT/US2019/018539 (May 1, 2019).
Int'l Written Opinion (Form PCT/ISA/237) conducted in Int'l Appln. No. PCT/US2019/018539 (May 1, 2019).
Russia Office Action conducted in counterpart Russia Appln. No. 2020129100/07 (Jun. 2, 2022).
Russia Search Report/Office Action conducted in counterpart Russia Appln. No. 2020129100/07 (May 23, 2022).

* cited by examiner

SINGLE ARC CASCADED LOW PRESSURE COATING GUN UTILIZING A NEUTRODE STACK AS A METHOD OF PLASMA ARC CONTROL

CROSS-REFERENCE TO RELATED APPLICATION

This International Application claims the benefit of U.S. Provisional Application No. 62/632,899 filed Feb. 20, 2018, the disclosure of which is expressly incorporated by reference herein in its entirety.

BACKGROUND OF THE INVENTION

1. Field of the Invention

Embodiments are directed to vacuum plasma guns, and more particularly to operating a vacuum plasma gun having a neutrode stack of a cascade type plasma gun or an optimized neutrode stack of a cascade type plasma gun.

2. Discussion of Background Information

Cascade type plasma guns provide advantages of allowing higher voltages and more stable plasma arcs resulting in more stable gun power. The drawback of such guns is the heat rejection resulting from the plasma arc traveling down a relatively long neutrode stack results in higher thermal losses and limits the practical length of the neutrode stack. Longer stacks result in higher thermal losses offsetting the advantages of higher voltages and more stable arcs. What is needed is a structure that optimizes the cooling in order to limit thermal losses without resulting in thermal damage to the neutrode stack.

Current neutrode stacks utilize drilled holes concentrically placed as close as practical to the plasma bore so as to remove heat that would result in damage to the neutrodes, the insulators, or the sealing O-rings. Plasma temperatures inside the plasma bore often exceed 20,000K so cooling of the stack is an essential requirement to prevent damage to the components.

Existing cooling designs for conventional plasma gun nozzles, water cooling channels and/or holes, are typically placed as close to the plasma gun bore as possible to keep temperature of the bore materials as low as possible to prevent damage. This design was carried into the designs for neutrodes as an effective way of cooling.

Recent inventive discoveries covering thermally optimized plasma gun nozzles, e.g., International Application No. PCT/US2013/076603, it was discovered that the nozzle cooling could be altered by moving the water passages away from the plasma gun bore and allow the copper material to move the heat reducing peak temperatures while increasing average temperatures. The water cooling cross section could be reduced to increase water velocity to provide effective cooling sufficient to maintain reasonable temperatures for the plasma gun nozzle while allowing for the increase in average temperature along the bore of the plasma nozzle.

SUMMARY OF THE EMBODIMENTS

In embodiments, the incorporation of a neutrode stack assembly or of an optimized neutrode stack assembly to a traditional vacuum plasma gun provides unique benefits in vacuum plasma processing, specifically: elimination of Helium or any other secondary gas, reduction of required current facilitating higher power operation and/or smaller power supplies. Existing vacuum plasma guns always require secondary gasses which are largely limited to the monatomics, such as helium, which are non-renewable resources that can become scarce or even unavailable. The optimized neutrode stack assembly is described in International Publication No. WO 2018/170090 published Sep. 20, 2018, which claims the benefit of Application No. U.S. Provisional Application No. 62/472,202 filed Mar. 16, 2017, the disclosures of which are expressly incorporated by reference herein in their entireties.

Embodiments of the invention are directed to operating a vacuum plasma gun that has been modified to include a neutrode stack or an optimized neutrode stack of a cascade-type plasma gun. In this manner, while known vacuum plasma guns, such as the Oerlikon Metco 03CP, require up to 2400 amps to support some coating requirements, the same coating can be produced using the vacuum plasma gun modified in accordance with the embodiments with as little as 1200 amps. In this way, practical limits can be placed on the total power available from the state of the art guns.

In addition to the use of known neutrode stacks for cascade-type plasma gun, embodiments of the invention are directed to design and implementation of a thermally optimized neutrode stack for use in vacuum plasma guns in order to reduce the thermal loss to the water while minimizing peak stack temperatures. Optimizing the cooling will permit longer neutrode stacks to be used without the penalty of high thermal losses.

In this regard, the inventors discovered that the technique of moving the water passages away from the plasma gun bore, which allows the copper material of the neutrode to move the heat reducing peak temperatures while increasing average temperatures, could be used on a vacuum plasma gun neutrode stack to improve the cooling characteristics without adverse effect on gun behavior.

In embodiments, the existing Oerlikon Metco 03CP vacuum gun can be modified to include the neutrode stack arrangement utilized in the Oerlikon Metco Triplex and/or Sinplex gun types or to include the optimized neutrode stack described herein. The processes, referred to as Vacuum plasma Spray (VPS), Low Pressure Plasma Spray (LPPS, LVPS) and Reduced Pressure Vacuum Spray (RPPS), require guns having specific design considerations to operate in reduced pressure environments which are not incorporated into the existing cascaded plasma guns. These considerations include, e.g., gas tight electrical isolation at the (−) negative connection region, and nozzle interior design geometry configuration for reduced pressure plume generation.

Embodiment are directed to a vacuum plasma gun that includes a rear gun body section comprising an electrode; and a cascade section configured to connect to the rear gun body section. The cascade section includes a plurality of neutrodes arranged to form a neutrode stack.

According to embodiments, a single gas is supplied as an only plasma gas source.

In accordance with other embodiments, an operational voltage of the gun is greater than 65 volts.

In other embodiments, the vacuum plasma gun can also include a nozzle coupled to an end of the neutrode stack, whereby the neutrode stack separates the electrode from the nozzle.

According to embodiments, each of the plurality of neutrodes can have a disk shape with a central bore and the plurality of neutrodes may be arranged so the central bores form a central plasma bore of the neutrode stack. The plurality of neutrodes can be electrically isolated from each other by insulators. The insulators may be configured to maintain an air or gas gap between adjacent neutrodes. Further, each of the plurality of neutrodes may include a plurality of cooling channels surrounding the central bore. The plurality of cooling channels can include axial bores extending through the disk. Moreover, the axial bores can be delimited within the neutrodes. In this regard, the axial bores may have a generally circular geometry through the neutrodes. Alternatively, the axial bores can be recesses open to an outer periphery of the neutrodes. The axial bores can have parallel side walls and a bottom wall generally perpendicular to the side walls.

In accordance with still other embodiments, the plurality of neutrodes can include disk shaped bodies having central axial bores, outer peripheral surfaces and pluralities of recesses surrounding the central axial bores.

In other embodiments, the plurality of neutrodes can be arranged so that the pluralities of recesses are aligned to form a plurality of axial cooling channels in the neutrode stack.

According to still other embodiments, the vacuum plasma gun may be configured for at least one of a vacuum plasma spray (VPS), low pressure plasma spray (LPPS, LVPS) or reduced pressure vacuum spray (RPPS) processes.

Embodiments are directed to a method of controlling plasma arc in a vacuum plasma gun that includes connecting a cascade neutrode stack to a rear body section of a vacuum plasma gun.

According to embodiments, the method can further include connecting the composite plasma gun to a single gas, which is used as an only plasma gas source.

In other embodiments, the method may further include supplying an operational voltage to the composite plasma gun of greater than 65 volts.

In accordance with still yet other embodiments, the cascade neutrode stack can include a plurality of neutrodes, in which each neutrode includes a disk shaped body having a central axial bore and a plurality of recesses surrounding the central axial bore. Moreover, the method can also include orienting the plurality of neutrodes in the cascade neutrode stack so that the plurality of recesses is axially aligned to form a plurality of axial cooling channels through the cascade neutrode stack.

Other exemplary embodiments and advantages of the present invention may be ascertained by reviewing the present disclosure and the accompanying drawing.

BRIEF DESCRIPTION OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
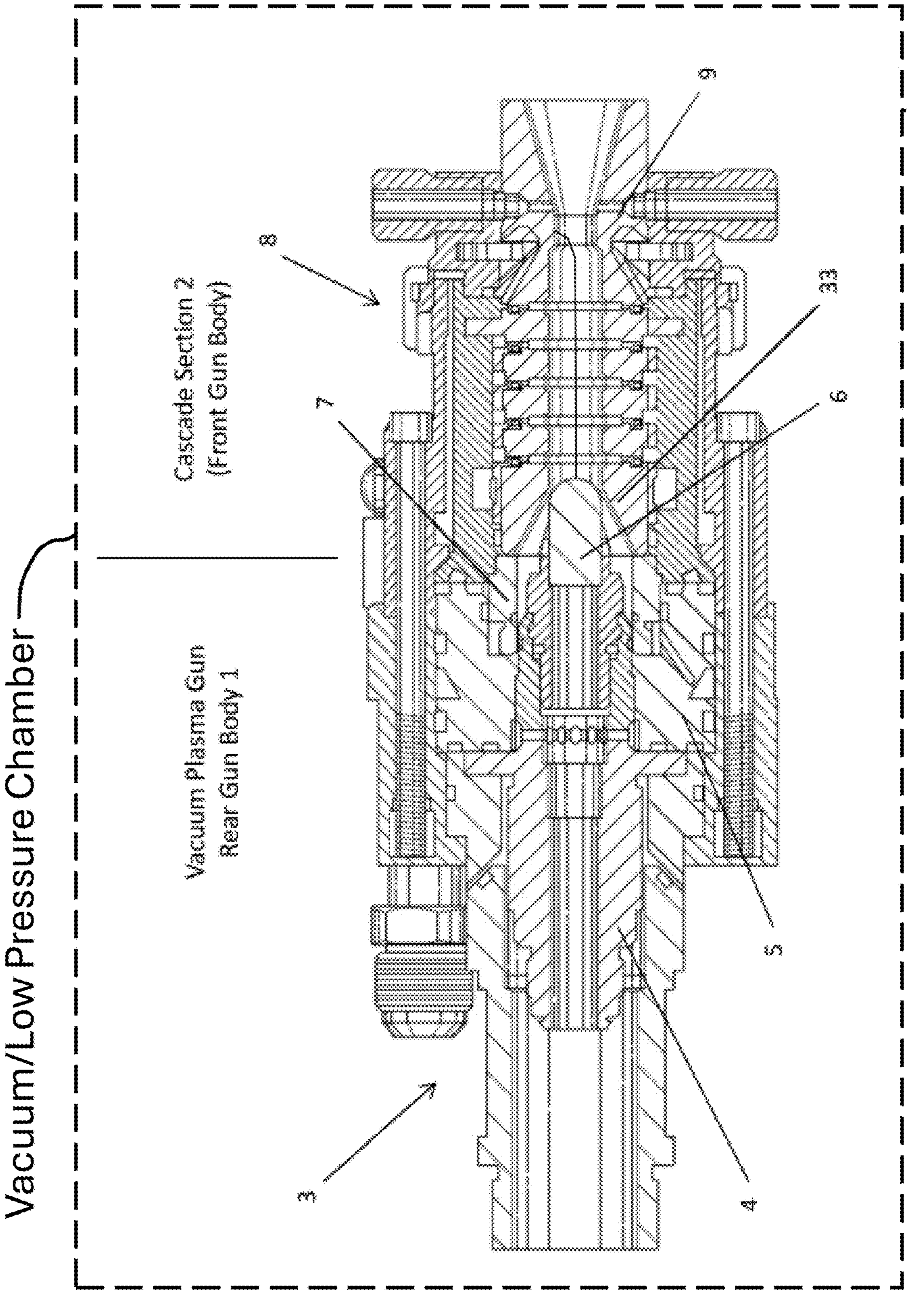
FIG. 1 illustrates a composite gun formed from a vacuum plasma gun rear and a cascade section of a cascade-type plasma gun.

In embodiments, a composite (vacuum) plasma gun can be formed from part of a known vacuum plasma gun that has been modified to include part of a cascade-type plasma gun utilizing a neutrode stack. In this way, a single arc cascaded low pressure coating gun utilizes the neutrode stack as a method of plasma arc control and extension. In particular, as shown in FIG. 1, a composite plasma gun can include a negative (rear) section 1 having a structure corresponding to a vacuum plasma gun, e.g., Oerlikon Metco 03CP gun, and a positive (front) gun section 2 having a structure corresponding to a cascade-type plasma gun that includes a specifically designed neutrode stack assembly. Further, it is contemplated that composite plasma gun can be a retrofitted vacuum plasma gun, in which the positive (front) section of a conventional vacuum plasma gun is removed from the negative (rear) section 1 and replaced with a redesigned positive (front) gun section 2 of a cascade-type plasma gun that includes a specifically designed neutrode stack assembly. The neutrode stack assembly is designed in such a fashion that the operational voltage of the gun will be higher than 65 volts when using a single gas as the only plasma gas source, as compared to the conventional Oerlikon Metco 03CP gun, which operates at 35 to 60 Volts using both Argon as a primary gas and Helium as a secondary gas. The front of the composite plasma gun incorporates water cooling circuits suitable for gun operation at up to 2000 Amps.

Negative (rear) section 1 of composite plasma gun comprises a rear insulator assay 3, which includes an electrode holder 4 structured to hold electrode (cathode) 6. Electrode 6 is further held within middle insulator 5, which abuts electrode holder 4. Electrode 6 extends outwardly from negative (rear) section 2. Positive (front) section 2 of composite plasma gun comprises a neutrode stack 8. Neutrode stack 8 includes, at an interior end, an end piece 33 having a conical opening that accommodates electrode 6 and, at an exterior end, a nozzle (anode) 9. Nozzle 9 can include, e.g., powder injectors, for supplying powder to a generated plasma jet before exiting nozzle 9. Between negative (rear) section 1 and positive (front) section 2, a gas ring 7 is arranged to prevent gas leakage, Thus, this composite plasma gun is different from the known Oerlikon Metco 03CP because it includes a neutrode stack between the electrode and nozzle, which makes the arc longer allowing for higher operational voltages and lower currents for the same power levels. This also allows the composite plasma gun to run higher voltages without damaging the gun with too much current, so that power can be increased to levels that the conventional single gas operation of the Oerlikon Metco 03CP could not handle. Further, the known Oerlikon Metco 03CP requires up to 2400 amps to support some coating requirements, while the same coatings can be produced using the composite plasma gun in accordance with embodiments of the invention with as little as 1200 amps. In this manner, practical limits can be placed on the total power available from the state of the art guns The single arc cascaded low pressure coating gun (composite plasma gun) is an improvement in the field of low pressure plasma spray coating production. The gun incorporates the existing body of knowledge from reduced pressure plasma spraying and solves known problems within the existing process while increasing efficiencies and lowering application costs. Key to this is the addition of the neutrode stack assembly to create a "cascaded" plasma gun arrangement adapted to the low pressure environment. A key feature of the design is its ability to replicate qualified industrial coatings without the use of Helium or any other secondary or ternary gas usage.

Figure 6:
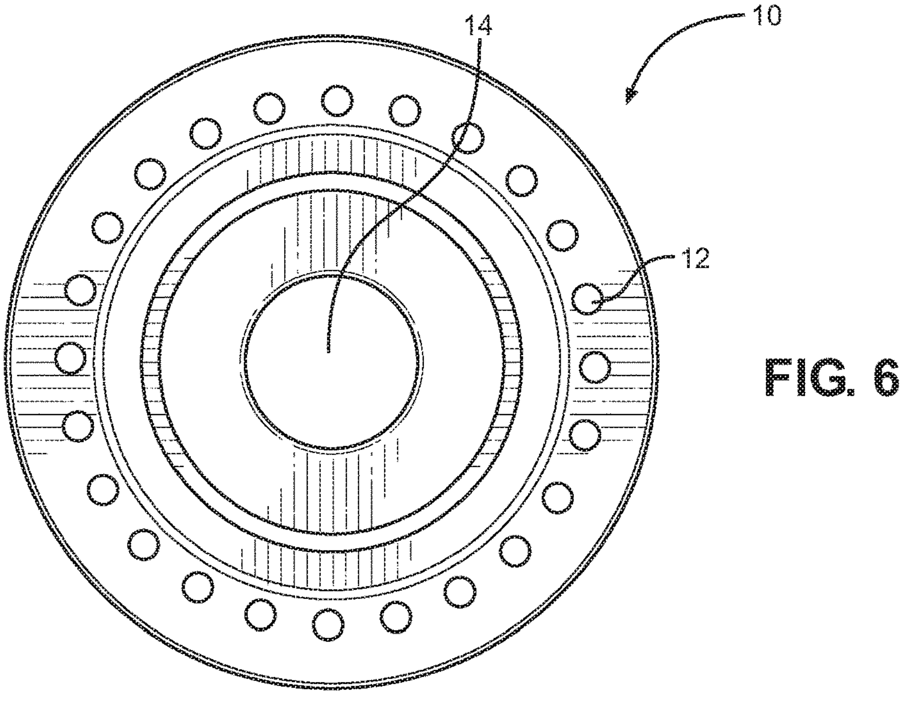
FIG. 6 illustrates a conventional neutrode of a known cascaded plasma gun.

FIG. 6 shows a cross sectional view of a conventional neutrode 10 from an existing cascaded plasma gun. It is apparent that the cooling in the conventional neutrode is provided by twenty four (24) holes 12 arranged around the central plasma bore 14 in proximity to the bore. Such conventional neutrodes 10 can be stacked together in the manner described in relation to use in known cascade-type plasma guns, such as, e.g., Oerlikon Metco Triplex and Sinplex gun types. In particular, neutrodes 10 can be electrically isolated from each other by positioning insulators between adjacent neutrodes 10 to maintain an air or gas gap between the adjacent neutrodes 10. Further, seals can be provided between holes 12 and central plasma bore 14 to prevent leakage of the cooling water into central plasma bore 14.

Figure 2A:
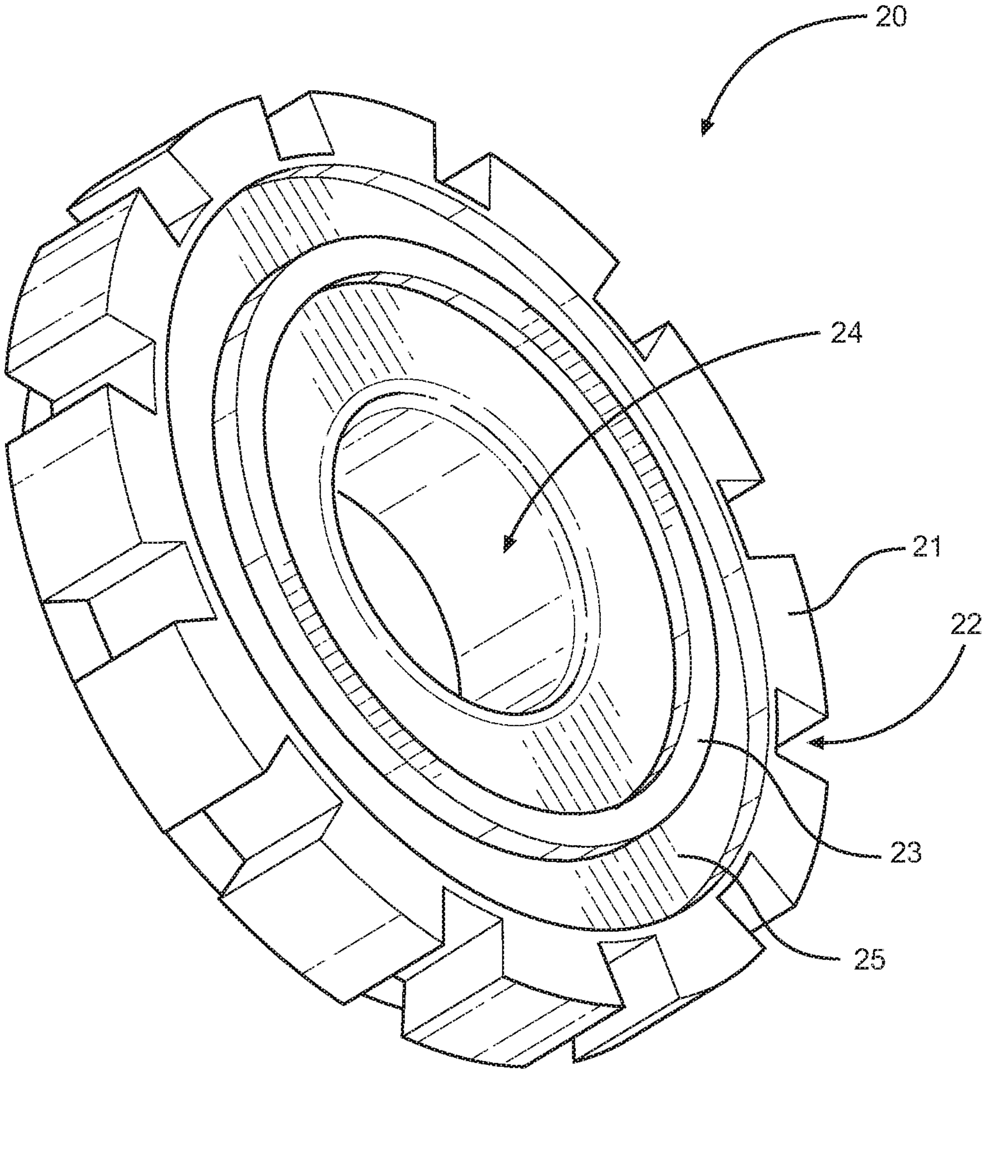
FIGS. 2A-2E illustrate various views of an exemplary optimized neutrode in accordance with embodiments of the invention.
Figure 2B:
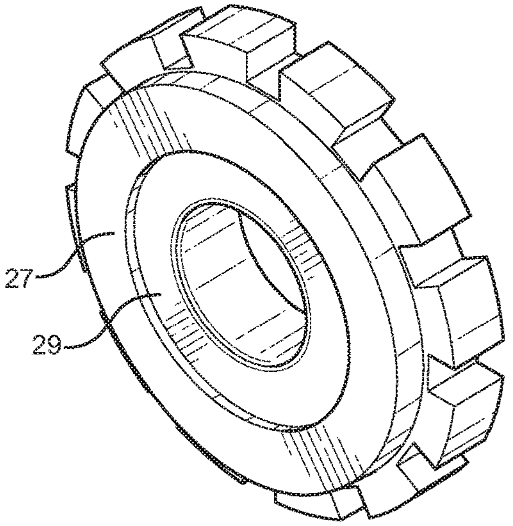
Figure 2C:
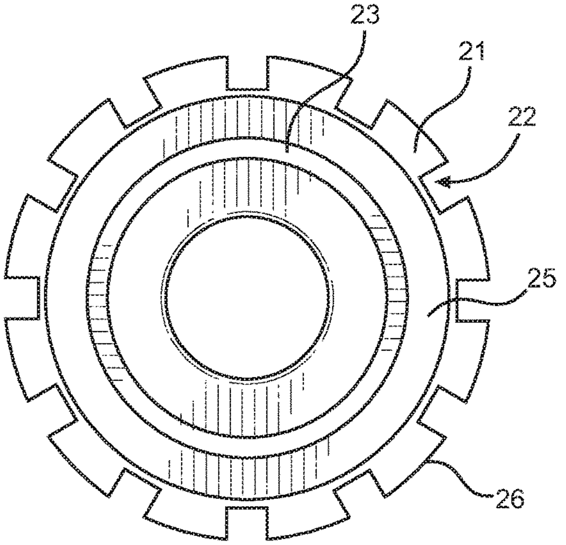
Figure 2D:
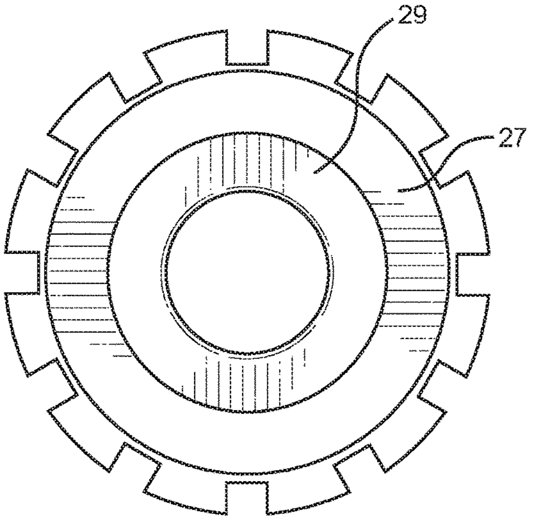
Figure 2E:
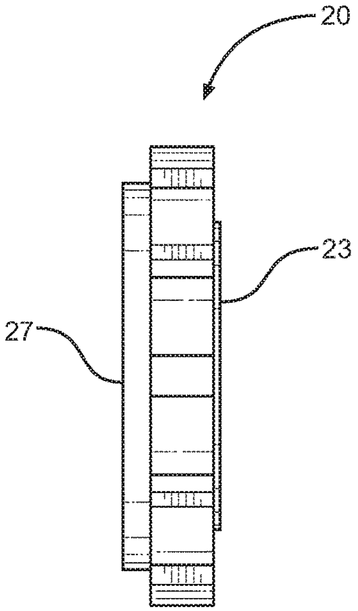

In contrast to the conventional neutrode 10, FIGS. 2A-2E show various views of an exemplary embodiment of a neutrode 20 of an optimized neutrode stack, as described in International Publication No. WO 2018/170090 published Sep. 20, 2018, which claims the benefit of Application No. U.S. Provisional Application No. 62/472,202 filed Mar. 16, 2017, the disclosures of which are expressly incorporated by reference herein in their entireties. Neutrode 20, as shown in the exemplary illustration, can include twelve (12) axial cooling channels 22 recessed in a body of neutrode 20 and are open to an outer peripheral surface 26 of neutrode 20 surrounding a central plasma bore 24. In this regard, the axially extending through recesses extend outwardly to define protrusions 21, which include portions of outer peripheral surface 26, such that outer peripheral surface 26 is circumferentially discontinuous. On a first side of neutrode 20, e.g., right-hand side shown perspectively in FIG. 2A and shown in plan view in FIG. 2C, a ridge 23 axially extends from a recessed surface 25 located below the right-hand side of protrusions 21. On a second side of neutrode 20, e.g., left-hand side shown perspectively in FIG. 2B and shown in plan view in FIG. 2D, a ridge 27 axially extends from a surface 29, which can be coplanar with the left-hand side of protrusions 21. FIG. 2E depicts a side view of neutrode 20 in which the axial extensions of ridges 23 and 27 extend beyond the planes of the left-hand and right-hand sides of protrusions 21. Further, in the non-limiting illustrated embodiment of FIGS. 2A-2E, the neutrode can generally has a gear shape, except the side walls of cooling channels 22 are preferably parallel to each other and the bottom wall is generally perpendicular to the side walls. Moreover, in the plan view of FIGS. 2C and 2D, cooling channels 22 exhibit a generally square shape in which a width of the recess, which is preferably constant over its depth, is substantially equal to the depth of the recess. While twelve axial channels are formed in the exemplary illustrations of neutrode 20, it is understood that neutrode 20 is not limited to only twelve axial channels, such that more or fewer axial channels can be formed in neutrode 20 without departing from the spirit and scope of the invention.

By way of non-limiting example, when viewed in the plan view depicted in at FIGS. 2C and 2D, channels 22 defined between protrusions 21 and/or recessed in the neutrode body and open to outer peripheral surface 26 have depth and width dimensions defining areas of channels 22. In a non-limiting example, channels 22 can have a base dimension of 0.125" (3.175 mm) wide by 0.097" (2.464 mm) deep, which provides a total area of 0.1476 square inches (95.22 $mm^2$). When operated at, e.g., a water flow of twenty two (22) liters per minute, the average water velocity through the channels can be, e.g., 3.8 m/sec. However, as noted above, these values for the channel are merely exemplary and the number and size of cooling channels 22 formed between protrusions 21 and/or recessed below and open to outer peripheral surface 26 of neutrode 20 depends upon the water flow needed to prevent temperatures from reaching levels that could damage the gun. By way of further example, channels 22 can be formed to be understood to be substantially square shaped in that the dimension for the depth is substantially the same as the dimension for the width, which is preferably a constant width, of channels 22. Further, while the substantially square shaped channels have a generally 1:1 ratio of width dimension forming a base of the channels to depth dimension below the outer peripheral surface, it is further understood that the ratio of width to depth for the cooling channels can vary within a range of ratios between 1:1-8:1.

Figure 3:
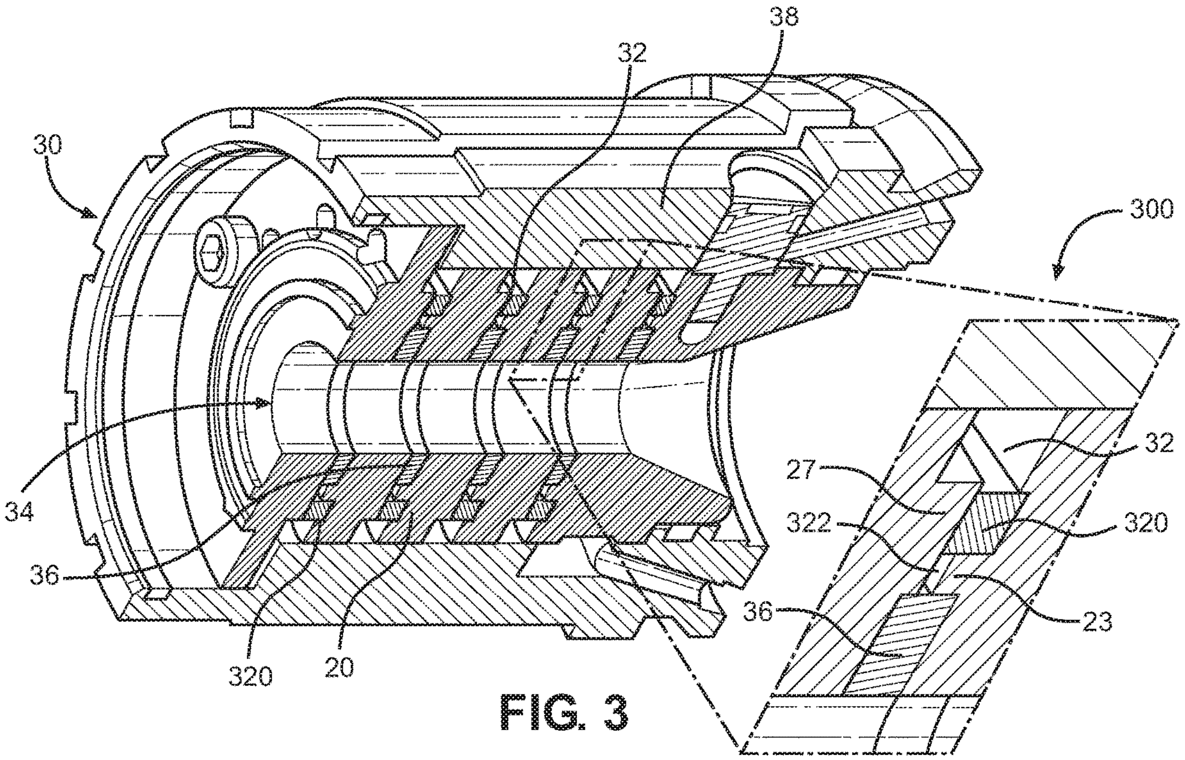
FIG. 3 illustrates a cross-sectional view of an embodiment of a neutrode stack, which includes a number of the optimized neutrodes depicted in FIG. 2.
Figure 4:
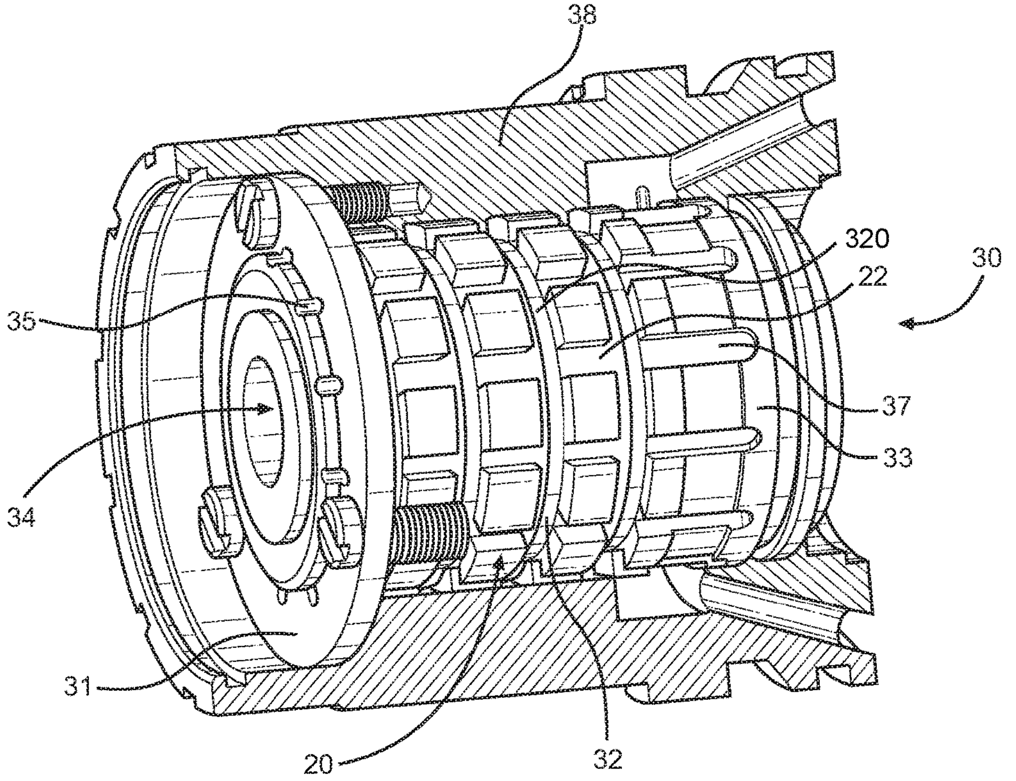
FIG. 4 illustrates the embodiment depicted in FIG. 3, in which the outer peripheries of the stacked optimized neutrodes are illustrated.

FIG. 3 shows a cross-sectional view of an exemplary neutrode stack 30 in a neutrode housing 38, which includes a plurality of the optimized neutrodes 20 depicted in FIGS. 2A-2E, which are coaxially stacked together, and FIG. 4 shows an alternative view of FIG. 3, in which the outer peripheries 26 of components within a cross-sectional view of neutrode stack housing 38, including the outer peripheries of the stacked optimized neutrodes 20, are shown. In the illustrated embodiments, when viewed from the left-hand side of neutrode stack 30, neutrodes 20 depicted in FIG. 2, can be located in, e.g., the second, third and fourth positions. However, the individual neutrodes 20 are isolated from each other, e.g., electrically isolated and physically spaced, so that adjacent neutrodes 20 do not contact each other in neutrode stack 30. Further, neutrode housing 38 can be made of, e.g., plastic, to likewise maintain the isolation between adjacent neutrodes 20 in neutrode stack 30.

As shown in FIG. 3, neutrodes 20 are concentrically aligned along central plasma bores 24 to form neutrode stack 30. In an advantageous and non-limiting embodiment, each neutrode 20 of neutrode stack 30 can have the same number of cooling channels and be oriented so that cooling channels 22 are axially aligned, as depicted in FIG. 4. As neutrodes 20 are isolated from each other in neutrode stack 30, an insulator 36 can be arranged between adjacent neutrodes 20 as a separator. Insulator 36 can be, e.g., boron nitrite, and can be located radially inside ridge 23 and extend radially inwardly to central plasma bore 34 of neutrode stack 30. In embodiments, transitions between central plasma bores 24 of individual neutrodes 20 and insulator 36 within central plasma bore 34 of neutrode 30 can be smooth. As more particularly shown in the inset 300, insulator 36 is suitably thick to maintain an air or gas gap 322 of, e.g., about 0.030" (0.76 mm) between facing surfaces of ridge 23 of a first neutrode 20 and ridge 27 of an adjacent neutrode 20. Further, radially outside of ridge 23, a seal 320, such as an O-ring, which can be made of, e.g., silicon, synthetic rubber such as, e.g., VITON®, nitrile rubber such as BUNA-N, or other suitable water sealing material suited to withstand the temperatures generated within the region of neutrode stack 30, can be arranged between the facing surfaces of adjacent neutrodes 20 in order to form and cover air or gas gap 322 and, thereby prevent cooling water ingress from the cooling channels radially inwardly into air or gas gap 322.

In the illustrated embodiments, neutrode stack 30 may be sandwiched between a larger diameter disk 31 having cooling water holes 35 and an end piece 33 having cooling channels 37, which can be terminated or blind cooling channels. End piece 33 can include an axially arranged conical depression, into which, the electrode (cathode) is positionable, as shown in FIG. 1. In advantageous and non-limiting embodiments, disk 31 includes a number of cooling water holes 35, which corresponds to the number of cooling channels 22 in each neutrode 20 and to the number of cooling channels 37 in end piece 33. On the surface of disk 1 opposite end piece 33, the nozzle (anode) is positionable, as shown in FIG. 1. As with the adjacent neutrodes 20 in neutrode stack 30, an insulator 36 and a seal 320 can be arranged between disk 31 and the nozzle in order to form and cover an air or gas gap 322 that prevents cooling water ingress from the cooling channels radially inwardly into this air or gas gap 322.

Further, cooling water holes 35, cooling channels 22 and cooling channels 37 can be oriented so as to be axially aligned, as depicted in FIG. 4. Still further, as the radially extending portions of neutrodes 20 that include peripheral surface 26 are separated from each other in the axial direction, circumferential cooling channels 32 are formed in neutrode stack 30. Larger diameter of disk 31 can be coupled housing 38, e.g., via screws, bolts, clamps, etc., and in doing so, can also bias stacked optimized neutrodes 20, insulators 36, seals 320 and end piece 33 together. Advantageously, the biasing is sufficient so that seals 320 suitably engage the facing surfaces of adjacent neutrodes to achieve a desired water sealing configuration. In embodiments, it is readily understood that neutrode stack 30 can include more or even fewer of the optimized neutrodes depicted in FIGS. 2A-2E. Moreover, it is further understood that neutrode stack housing 38 can include similar cooling channels formed in or on the outer periphery of the housing.

Figure 5:
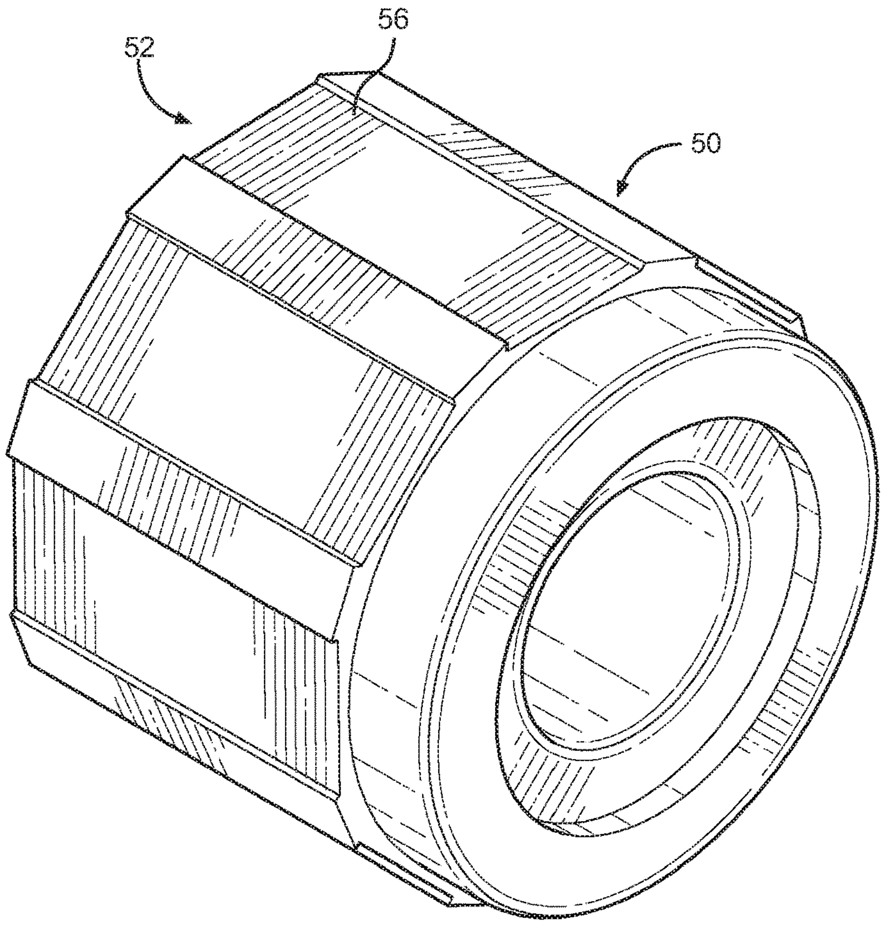
FIG. 5 illustrates another embodiment of an optimized neutrode in accordance with embodiments of the invention.

FIG. 5 shows another exemplary embodiment of a neutrode 50. In this embodiment, neutrode 50 can include eight (8) flattened cooling channels 52 formed in and around the outer periphery 56 of neutrode 50. By way of non-limiting example, flattened channels 52 formed in periphery 56 of neutrode 50 can be 0.200" (5.08 mm) wide by 0.0225" (0.572 mm) deep, which provides a total area of 0.032 square inches (20.65 $mm^2$). When operated at a water flow of 9 liters per minute the average water velocity through the channels is 6.4 m/sec. However, as noted above, these values for the channel are merely exemplary and the number and size of the cooling channels depends upon the water flow needed to prevent temperatures from reaching levels that could damage the gun.

According to embodiments, a neutrode stack can be provided with water cooling channels arranged at an outer perimeter of each optimized neutrode, as shown, e.g., in FIGS. 2A, 5. The cross sectional areas of the channels can be designed to create high water velocities, e.g., greater than 1.0 m/sec, preferably greater than 2.0 m/sec, and most preferably greater than 3.0 m/sec. Each channel can be structured with shapes ranging from a roughly square shape, see, e.g., FIG. 2A-2E, to an elongated and flattened shape, see, e.g., FIG. 5, in order to maximize the water cooling flow at the outermost periphery of the neutrodes 20. Moreover, the channels can also be structured or formed with triangular cross-sections and arranged to maximize the water cooling flow at the outer periphery of each neutrode. The number and size and geometry of the cooling channels are dependent upon the required water flow to prevent temperatures from reaching levels that could damage the gun. The total number of neutrodes in the neutrode stack or thickness of each neutrode of the neutrode stack is not limited in this design. In fact, with the optimized neutrodes according to embodiments, longer neutrode stacks are now possible with limited thermal cooling losses.

It is noted that the embodiments are not limited to the above-described specific examples of base to depth ratios for the cooling channels. It is understood that the ratio of base to depth for the cooling channels can be up to 1:1 to achieve cooling channels ranging from taller radial profiles to a generally square cross-section, greater than 8:1 to achieve a flatter profile cross-sections, and any ratio within the range between 1:1 and 8:1. Thus, the ratio can be, but again is not limited to, specific ratios of base to depth of 2:1, 3:1, 4:1, 5:1, 6:1, 7:1, as well as any ratios there between.

In the composite plasma gun in accordance with the described embodiments utilizing a neutrode stack formed by a plurality of neutrodes 50, as depicted in FIG. 5, water flow in a plasma gun, as computed via known computational fluid dynamics (CFD) software, reveals that with a 8.1 liters per minute water flow, the average water velocity in the neutrode stack was above 3.2 m/sec.

A composite plasma gun incorporating neutrode stack 30, as depicted in FIG. 3, was tested and compared to a conventional plasma gun of the same overall design, which included a long nozzle that used water cooling fins or channels to cool the plasma nozzle. The test results showed a 10% increase in thermal efficiency with the gun using neutrode stack 30 according to the embodiments of the invention over the conventionally cooled nozzle. Other testing showed that adding conventional neutrode stacks to plasma guns reduced thermal efficiency from between 6% and 10%. Still further testing showed that doubling the length of a conventional neutrode stack for a plasma gun reduced thermal efficiency by 20% while increasing the length of neutrode stack 30 with added optimized neutrodes 20 had a much lower decrease in thermal efficiency, which worked out to be about less than one-half that of conventional neutrode stacks. Moreover, duration testing of neutrode stack 30 showed no adverse thermal effects even after more than 200 hours of testing with the same stack.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A vacuum plasma gun comprising:

a rear gun body section comprising an electrode; and a cascade section configured to connect to the rear gun body section, wherein the cascade section comprises a plurality of neutrodes arranged to form a neutrode stack, wherein the plurality of neutrodes are electrically isolated from each other by insulators and wherein the insulators are configured to maintain an air or gas gap of about 0.030 inches between adjacent neutrodes.

2. The vacuum plasma gun according to claim 1, wherein a single gas is supplied as an only plasma gas source.

3. The vacuum plasma gun according to claim 1, wherein an operational voltage of the gun is greater than 65 volts.

4. The vacuum plasma gun according to claim 1, further comprising a nozzle coupled to an end of the neutrode stack, whereby the neutrode stack separates the electrode from the nozzle.

5. The vacuum plasma gun according to claim 1, wherein each of the plurality of neutrodes has a disk shape with a central bore, and wherein the plurality of neutrodes is arranged so the central bores form a central plasma bore of the neutrode stack.

6. The vacuum plasma gun according to claim 5, wherein each of the plurality of neutrodes includes a plurality of cooling channels surrounding the central bore.

7. The vacuum plasma gun according to claim 6, wherein the plurality of cooling channels comprises axial bores extending through the disk.

8. The vacuum plasma gun according to claim 7, wherein the axial bores are delimited within the neutrodes.

9. The vacuum plasma gun according to claim 8, wherein the axial bores have a generally circular geometry through the neutrodes.

10. The vacuum plasma gun according to claim 7, wherein the axial bores are recesses open to an outer periphery of the neutrodes.

11. The vacuum plasma gun according to claim 10, wherein the axial bores have parallel side walls and a bottom wall generally perpendicular to the side walls.

12. The vacuum plasma gun according to claim 1, wherein the plurality of neutrodes comprises disk shaped bodies having central axial bores, outer peripheral surfaces and pluralities of recesses surrounding the central axial bores.

13. The vacuum plasma gun according to claim 1, wherein the plurality of neutrodes are arranged so that the pluralities of recesses are aligned to form a plurality of axial cooling channels in the neutrode stack.

14. The vacuum plasma gun according to claim 1, wherein the disk shaped body has an outer peripheral surface and the plurality of recesses are formed at least one of in or on the outer peripheral surface.

15. The vacuum plasma gun according to claim 1, wherein a central bore extends through the neutrode stack and the insulators are configured to separate the air or gas gap between adjacent neutrodes from the central bore.

16. The vacuum plasma gun according to claim 1, which is configured for operation in reduced pressure environments using at least one of vacuum plasma spray (VPS), low pressure plasma spray (LPPS, LVPS) or reduced pressure vacuum spray (RPPS) processes.

17. A method of extending a plasma arc in a vacuum plasma gun comprising:

connecting a cascade neutrode stack to a rear body section of a vacuum plasma gun, wherein the cascade neutrode stack comprises a plurality of neutrodes, in which each neutrode comprises a disk shaped body having a central axial bore and a plurality of recesses surrounding the central axial bore, orienting the plurality of neutrodes in the cascade neutrode stack so that the plurality of recesses is axially aligned to form a plurality of axial cooling channels through the cascade neutrode stack, and directing the plasma arc from the electrode, through the central axial bores of the plurality of neutrodes of cascade neutrode stack, to the nozzle.

18. The method in according to claim 17, further comprising connecting the composite plasma gun to a single gas, which is used as an only plasma gas source.

19. The method according to claim 17, further comprising supplying an operational voltage to the composite plasma gun of greater than 65 volts.

20. The method according to claim 17, the method further comprising arranging insulators between adjacent neutrodes in the neutrode stack to electrically isolate the neutrodes from each other and to maintain an air or gas gap between the adjacent neutrodes that is separated from the central bore.

21. The method according to claim 17, wherein the plasma gun in which the plasma arc is extended is configured for operation in reduced pressure environments using at least one of vacuum plasma spray (VPS), low pressure plasma spray (LPPS, LVPS) or reduced pressure vacuum spray (RPPS) processes.

* * * * *